(12) United States Patent
Hayashi

(10) Patent No.: US 10,388,835 B2
(45) Date of Patent: Aug. 20, 2019

(54) LIGHT EMITTING DEVICE AND METHOD OF MANUFACTURING SAME

(71) Applicant: NICHIA CORPORATION, Anan-shi, Tokushima (JP)

(72) Inventor: Hirosuke Hayashi, Naruto (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/916,725

(22) Filed: Mar. 9, 2018

(65) Prior Publication Data

US 2018/0269361 A1    Sep. 20, 2018

(30) Foreign Application Priority Data

Mar. 17, 2017    (JP) .................................. 2017-052051

(51) Int. Cl.
| | |
|---|---|
| *H01L 33/50* | (2010.01) |
| *H01L 33/10* | (2010.01) |
| *H01L 33/38* | (2010.01) |
| *H01L 33/40* | (2010.01) |
| *H01L 33/48* | (2010.01) |
| *H01L 33/58* | (2010.01) |

(52) U.S. Cl.
CPC ............ *H01L 33/501* (2013.01); *H01L 33/10* (2013.01); *H01L 33/38* (2013.01); *H01L 33/40* (2013.01); *H01L 33/505* (2013.01); *H01L 33/486* (2013.01); *H01L 33/58* (2013.01); *H01L 2933/0041* (2013.01); *H01L 2933/0091* (2013.01)

(58) Field of Classification Search
CPC ........ H01L 33/501; H01L 33/10; H01L 33/38
See application file for complete search history.

(56) References Cited

U.S. PATENT DOCUMENTS

| | | | |
|---|---|---|---|
| 2009/0101929 A1 | 4/2009 | Mo et al. | |
| 2011/0227235 A1* | 9/2011 | Yoshitake | ............... C08L 83/04 257/791 |
| 2012/0256224 A1* | 10/2012 | Hatanaka | ............ C23C 18/1608 257/98 |
| 2017/0250317 A1* | 8/2017 | Chen | ....................... H01L 33/56 |

FOREIGN PATENT DOCUMENTS

| | | |
|---|---|---|
| JP | 2011-501428 A | 1/2011 |
| JP | 2012-134355 A | 7/2012 |
| JP | 2014-067876 A | 4/2014 |
| JP | 5518662 B2 | 6/2014 |
| JP | 2014-207378 A | 10/2014 |

* cited by examiner

*Primary Examiner* — Errol V Fernandes
(74) *Attorney, Agent, or Firm* — Global IP Counselors, LLP

(57) ABSTRACT

A light emitting device includes a light emitting element, a transmissive member, and a light reflective member. The transmissive member is arranged on the light emitting element, and has a wavelength conversion member and a film. The film constitutes at least a part of an outermost surface of a side surface of the transmissive member. A surface free energy of a base material of the film is lower than a surface free energy of a base material of the wavelength conversion layer. The light reflective member encloses a side surface of the light emitting element and the side surface of the transmissive member while a top surface of the transmissive member is exposed from the light reflective member.

15 Claims, 6 Drawing Sheets

LIGHT EMITTING DEVICE AND METHOD OF MANUFACTURING SAME

CROSS-REFERENCE TO RELATED APPLICATIONS

This application claims priority to Japanese Patent Application No. 2017-052051 filed on Mar. 17, 2017. The entire disclosure of Japanese Patent Application No. 2017-052051 is hereby incorporated herein by reference.

BACKGROUND

The present disclosure relates to a light emitting device and a method of manufacturing the same.

For example, in Japanese Laid-Open Patent Application Publication No. 2012-134355 (particularly in reference to the background art), an LED package is described, which periphery of an LED and a phosphor-containing resin is covered by a white resin.

SUMMARY

The phosphor-containing resin and white resin of the light emitting device of the aforementioned prior art may have cracks occur as a result of stress due to thermal expansion and/or degradation due to light and/or degradation due to heat.

In view of that, an object of an embodiment of the present invention is to provide a light emitting device in which cracks are less likely to occur in a wavelength conversion member provided on a light emitting element and/or a light reflective member covering the side surface of the light emitting element, and the manufacturing method thereof.

A light emitting device of an embodiment includes a light emitting element, a transmissive member, and a light reflective member. The transmissive member is arranged on the light emitting element, and includes a wavelength conversion member and a film. The film constitutes at least a part of an outermost surface of a side surface of the transmissive member. A surface free energy of a base material of the film is lower than a surface free energy of a base material of the wavelength conversion layer. The light reflective member encloses a side surface of the light emitting element and the side surface of the transmissive member while a top surface of the transmissive member is exposed from the light reflective member.

A light emitting device of another embodiment includes a light emitting element, a transmissive member, and a light reflective member. The transmissive member is arranged on the light emitting element, and including a wavelength conversion member. The light reflective member encloses a side surface of the light emitting element and a side surface of the transmissive member. A top end part of the light reflective member is positioned at approximately the same height as a top surface of the transmissive member. The top end part of the light reflective member is separated from the side surface of the transmissive member by a gap.

A method of manufacturing a light emitting device of an embodiment includes: providing a transmissive member having a wavelength conversion member and a film so that the film constitutes at least a part of an outermost surface of a side surface of the transmissive member, and a surface free energy of a base material of the film is lower than a surface free energy of a base material of the wavelength conversion member; placing the transmissive member on a light emitting element; and forming a light reflective member so as to enclose a side surface of the light emitting element and a side surface of the transmissive member.

With the embodiments noted above, it is possible to provide a light emitting device in which cracks are less likely to occur in the wavelength conversion member and/or the light reflective member.

DETAIL DESCRIPTION OF EMBODIMENTS

Figure 1A:
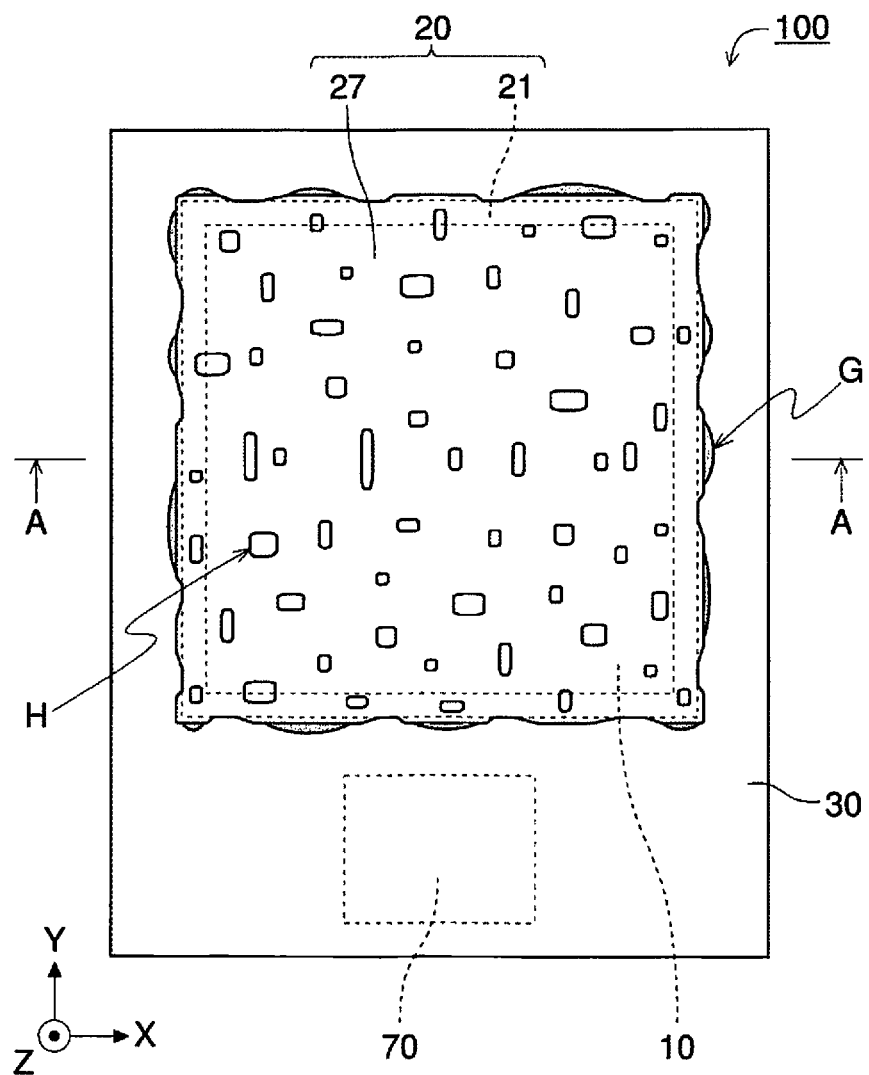
FIG. 1A is a schematic top view of a light emitting device of an embodiment of the present invention.

Hereafter, embodiments of the present invention are explained while referring to the drawings as appropriate. However, the light emitting device and manufacturing method of the same explained hereafter are for embodying the technical concept of the present invention, and unless specifically noted, the present invention is not limited to the following. Also, the contents explained for one embodiment also apply to other embodiments. Also, the size, positional relationship, etc., of the members shown in the drawings may sometimes be exaggerated to clarify the explanation.

In the drawings, with the light emitting device, the width direction is indicated as the X direction, the depth direction is indicated as the Y direction, and the vertical/thickness direction is indicated as the Z direction. Each of these X, Y, and Z directions/axes are perpendicular directions/axes to the other two directions/axes. In more detail, the left to right direction is the X+ direction, the right to left direction is the X− direction, the depth direction is the Y+ direction, the frontward direction is the Y− direction, the upward direction is the Z+ direction, and the downward direction is the Z− direction. The principal light emitting direction of the light emitting device is the upward direction. The side direction, for example, is the direction parallel to the surface extending in the width direction and the depth direction, specifically, the XY plane.

Also, the wavelength in a range of from 380 nm-780 nm is referred to as visible wavelength range, the wavelength in a range of from 420 nm-480 nm is referred to as the blue wavelength range, the wavelength in a range of from 500 nm-560 nm is referred to as the green wavelength range, the wavelength in a range of longer than 560 nm and 590 nm or less is referred to as the yellow wavelength range, and the wavelength in a range of from 610 nm-750 nm is referred to as the red wavelength range.

Also, "transmissive" in this specification means that the light transmittance at the light emission peak wavelength of the light emitting element is 60% or greater, more preferably 70% or greater, and even more preferably 80% or greater. "Light reflective" in this specification means that the light reflectivity at the light emission peak wavelength of the light emitting element is 60% or greater, more preferably 70% or greater, and even more preferably 80% or greater.

Embodiment 1

Figure 1B:
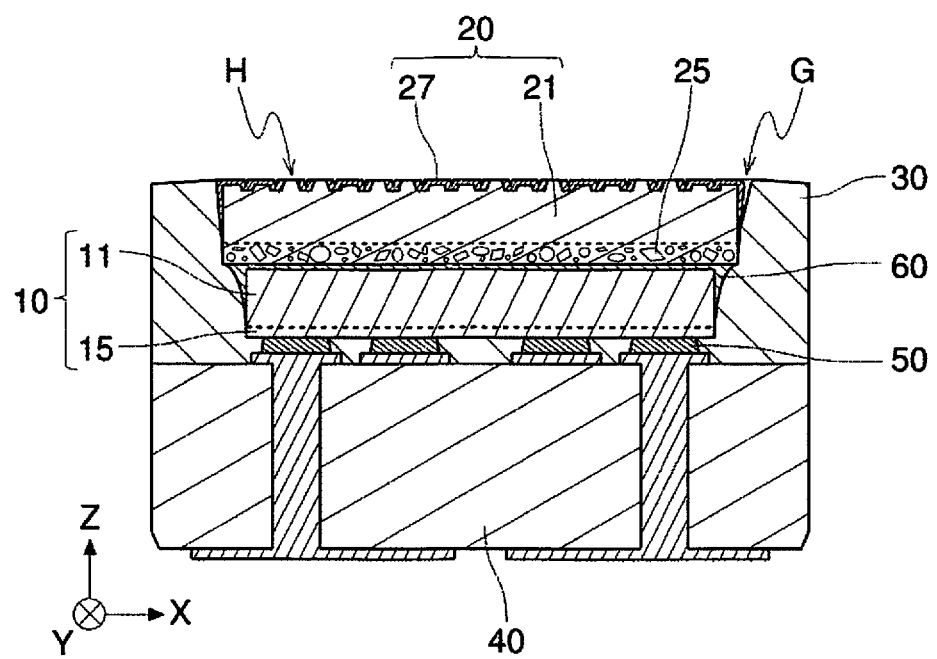
FIG. 1B is a schematic cross section view taken along a line A-A of the light emitting device shown in FIG. 1A.

FIG. 1A is a schematic top view of a light emitting device 100 of Embodiment 1 of the present invention. FIG. 1B is a schematic cross section view of cross section A-A of the light emitting device 100 shown in FIG. 1A.

As shown in FIGS. 1A and 1B, the light emitting device 100 of Embodiment 1 includes a light emitting element 10, a transmissive member 20, and a light reflective member 30. The transmissive member 20 is provided above the light emitting element 10. The transmissive member 20 includes a wavelength conversion member 21 and a film 27. The light reflective member 30 covers the side surface of the light emitting element 10. The top surface of the transmissive member 20 is exposed from the light reflective member 30, and encloses the side surface of the transmissive member 20. The film 27 is provided on the outermost surface of the side surface of the transmissive member 20. Also, the base material of the film 27 has a surface free energy that is lower than that of the base material of the wavelength conversion member 21.

In the light emitting device 100 having such a configuration, the surface free energy of the base material of the film 27 is lower than the surface free energy of the base material of the wavelength conversion member 21, so the wettability of the light reflective member 30 to the film 27 is inhibited more than the wettability of the light reflective member 30 to the wavelength conversion member 21. Thus, the adhesiveness of the film 27 with the light reflective member 30 can be made lower than the adhesiveness of the wavelength conversion member 21 with the light reflective member 30. Therefore, it is possible to reduce the stress caused by mutually pressing force due to thermal expansion of the wavelength conversion member 21 and/or the light reflective member 30. Also, light travelling and/or heat transfer from the wavelength conversion member 21 to the light reflective member 30 is inhibited, so it is possible to reduce degradation of the light reflective member 30 due to light and/or heat. In particular, when separation and thus a gap G is formed between the film 27 and the light reflective member 30, these effects are significant. From the points noted above, with the light emitting device 100 of Embodiment 1, crack is less likely to occur in the wavelength conversion member 21 and/or the light reflective member 30. This can realize a light emitting device whose initial characteristics such as light distribution is likely to be maintained over a long period, thereby being highly reliable.

The light emitting device 100 of Embodiment 1 further includes a wiring substrate 40, a joining member 50, a light guide member 60, and a protective element 70. The light emitting element 10 includes a substrate 11 and a semiconductor layer 15. The substrate 11 side of the light emitting element 10 is connected to the transmissive member 20 with the light guide member 60 therebetween. The semiconductor layer 15 side of the light emitting element 10 is connected to the wiring of the wiring substrate 40 with the joining member 50 therebetween. The wavelength conversion member 21 contains a fluorescent substance 25. The protective element 70 is mounted on the wiring substrate 40, and is electrically connected to the light emitting element 10 using wiring.

The surface free energy of a solid can be evaluated by measuring the contact angle of a liquid for which the surface free energy (surface tension) is already known in relation to that solid. In regards to the measurement method, it is possible to reference or conform to JIS (Japanese Industrial Standard) R 3257 and JIS K 6768.

Following is a detailed description of a preferred mode of the light emitting device 100 of Embodiment 1.

As shown in FIGS. 1A and 1B, in the light emitting device 100 of Embodiment 1, the film 27 is provided extending from the top end part of the side surface of the transmissive member 20 to the bottom side. It is preferable that the film 27 be provided at least on the top end part of the side surface of the transmissive member 20 in this way. The top end part of the transmissive member 20 and the light reflective member 30 is exposed to the device exterior, and is not in contact with the other constituent elements within the light emitting device 100 at the upper part thereof. As a result, the wettability of the light reflective member 30 is inhibited at the top end part of the side surface of the transmissive member 20, thereby enabling lowering the adhesiveness with the light reflective member 30. Thus, it is easier to release the stress generated by thermal expansion of the wavelength conversion member 21 and/or the light reflective member 30. Also, the light reflective member 30 is less likely to creep up on the top surface of the transmissive member 20, so that a decrease in the light extraction efficiency can be inhibited.

As shown in FIGS. 1A and 1B, the film 27 is localized to the upper side of the side surface of the transmissive member 20 in the light emitting device 100 of Embodiment 1. The surface area of the film 27 is preferably larger at the upper half than the lower half of the side surface of the transmissive member 20 in this way in the cross-sectional view as shown in FIG. 1B. The top end part of the transmissive member 20 and the light reflective member 30 are exposed to the device exterior, and has no area contact with the other constituent elements within the light emitting device 100 in the upper part. As a result, the wettability of the light reflective member 30 is reduced with priority at the top side of the side surface of the transmissive member 20, thereby enabling lowering the adhesiveness with the light reflective member 30 with priority. This can reduce the stress that occurs due to thermal expansion of the wavelength conversion member 21 and/or the light reflective member 30.

As shown in FIGS. 1A and 1B, the wavelength conversion member 21 in the light emitting device 100 of Embodiment 1 is configured with a lower layer containing the fluorescent substance 25, and an upper layer that does not contain or is substantially free of the fluorescent substance. In this case, the ratio of the part on which the film 27 is provided with respect to the part on which the film 27 is not provided on the side surface of the upper layer is preferably larger than that on the side surface of the lower layer. In this way, the adhesiveness is likely to be lower between the light reflective member 30 and the side surface of the upper layer that does not contain or is substantially free of the fluorescent substance, and the adhesiveness is likely to be maintained between the light reflective member 30 and the side surface of the lower layer that does contain the fluorescent substance 25. This can inhibit degradation of the fluorescent substance 25 due to outside air, and occurrence of cracks in the wavelength conversion member 21 and/or the light reflective member 30.

In a portion of the light emitting device 100 of embodiment 1, separation between the film 27 and the light reflective member 30 progresses, and thus the gap G is formed as shown in FIGS. 1A and 1B. It is preferable that the gap G between the film 27 and the light reflective member 30 be provided in this way. In the case of thermal expansion of the wavelength conversion member 21 and the light reflective member 30, mutual pressure is alleviated in the regions having the gap G, thus the stress can further be reduced. Also, in the regions having the gap G, there is separation between the wavelength conversion member 21 and the light reflective member 30, thereby inhibiting light travelling and/or heat transfer from the wavelength conversion member 21 to the light reflective member 30. Furthermore, total reflection of light occurs at the inside surface of the film 27, making it is easier to maintain a high light extraction efficiency. In particular, as shown in FIGS. 1A and 1B, the aforementioned effects can be readily obtained by the gap G being provided between the light reflective member 30 and the film 27 provided on the top end part of the side surface of the transmissive member 20.

As shown in FIGS. 1A and 1B, the light emitting device 100 of embodiment 1 has a structure that the film 27 is provided continuously from the top surface of the transmissive member 20 to the side surface. It is preferable that the film 27 also be provided on the top surface of the transmissive member 20 in this way. The creeping up of the light reflective member 30 to the top surface of the transmissive member 20 is even further inhibited, thereby even further inhibiting a decrease in the light extraction efficiency. Furthermore, because materials such as fluorine-based material and silicone-based material, which are useful as the base material of the film 27 have a relatively low index of refraction, it is possible to increase the light extraction efficiency from the top surface of the transmissive member 20. Also, the fluorine-based material has good gas barrier properties, making it easy to inhibit degradation of the fluorescent substance 25 due to outside air. Also, the fluorine-based material has low viscosity, thus it is possible to reduce viscosity (i.e., surface tackiness) of the top surface of the transmissive member 20, thereby enabling reduction in adherence of the light emitting device to the cover tape and in release failure during collet transport.

As shown in FIGS. 1A and 1B, the light emitting device 100 of Embodiment 1 has a structure that the bottom end part of the side surface of the transmissive member 20 is covered by the light reflective member 30. The light reflective member 30 covers the bottom end part of the side surface of the transmissive member 20 in this way, thus the light emitting element 10 and the fluorescent substance 25 are less likely to degrade due to outside air, and occurrence of cracks can be reduced in the wavelength conversion member 21 and/or the light reflective member 30. Also, the emission of light with strong color of the light of the light emitting element 10 from near the side surface of the transmissive member 20 is inhibited, making it easier to obtain light emission with little non-uniformity in the distribution of emission color of light.

As shown in FIGS. 1A and 1B, holes H are scattered in the film 27 in the light emitting device 100 of embodiment 1. It is preferable that the film 27 have a plurality of holes H in this way. The flexibility of the film 27 increases with this plurality of holes H, and it is possible to reduce stress caused by pressing the film 27 and the wavelength conversion member 21 each other due to thermal expansion of the wavelength conversion member 21. This can be obtained, for example, in cases such as when the surface of the wavelength conversion member 21 has surface irregularities, with the film formation of the film 27 concentrated on the concave parts of the surface of the wavelength conversion member 21, and suppressed at the convex parts, resulting in the holes H.

As shown in FIGS. 1A and 1B, the light emitting device 100 of Embodiment 1 has a structure that the top end part of the light reflective member 30 are aligned approximately laterally to the corner defined by the top surface and side surface of the transmissive member 20. As such, the top end part of the light reflective member 30 is preferably positioned at the same height as the top surface of the light transmissive member 20. By having the inner wall surface of the light reflective member 30 face opposite the approximately entire area of the side surface of the transmissive member 20, the light emitted from the side surface of the transmissive member 20 and travel toward the side is likely to upwardly reflect, thereby obtaining light with little non-uniformity of the color distribution.

The base material of the film 27 preferably has a surface free energy that is lower than that of the base material of the light reflective member 30. This is because the wettability of the light reflective member 30 to the outer surface of the film 27 is reduced, and adhesiveness between the film 27 and the light reflective member 30 is likely to be low.

Method of Manufacturing Light Emitting Device 100

Figure 2A:
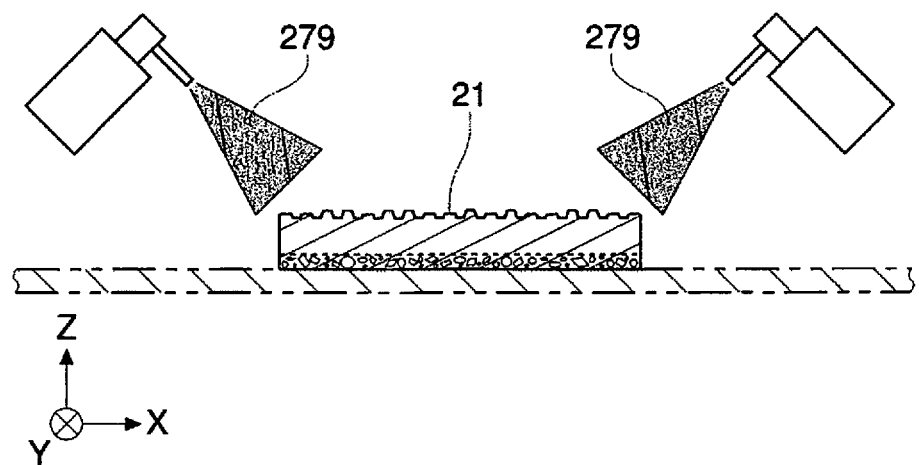
FIG. 2A is a schematic cross section view showing one step of the method of manufacturing a light emitting device of an embodiment of the present invention.
Figure 2B:
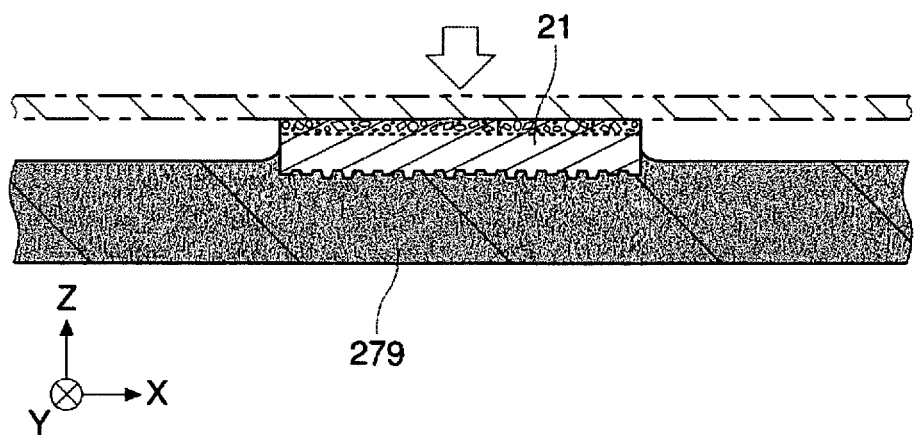
FIG. 2B is a schematic cross section view showing one step of the method of manufacturing a light emitting device of an embodiment of the present invention.
Figure 2C:
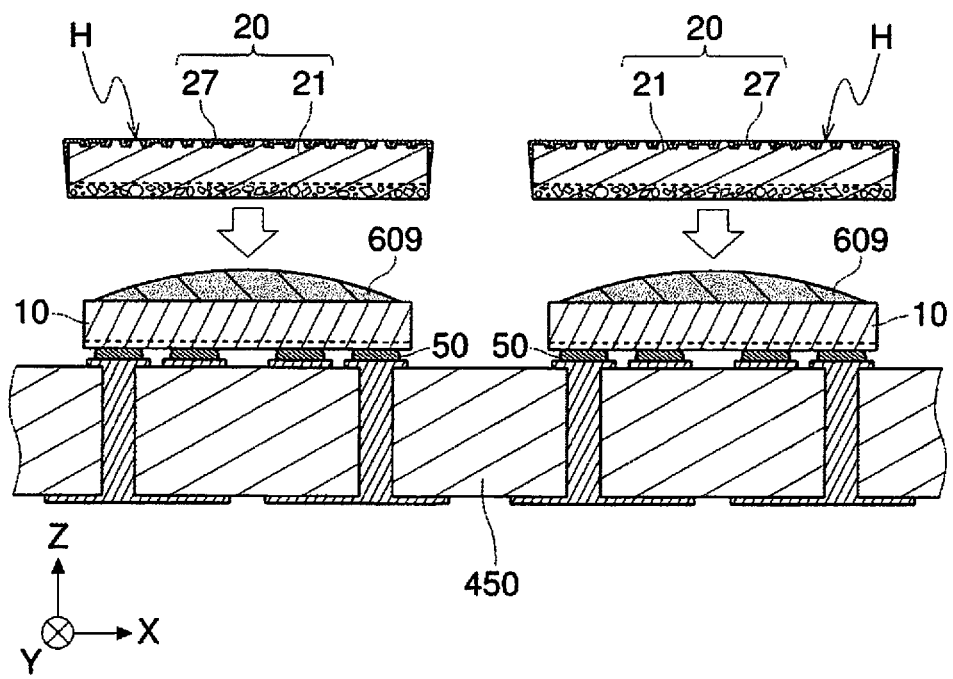
FIG. 2C is a schematic cross section view showing one step of the method of manufacturing a light emitting device of an embodiment of the present invention.
Figure 2D:
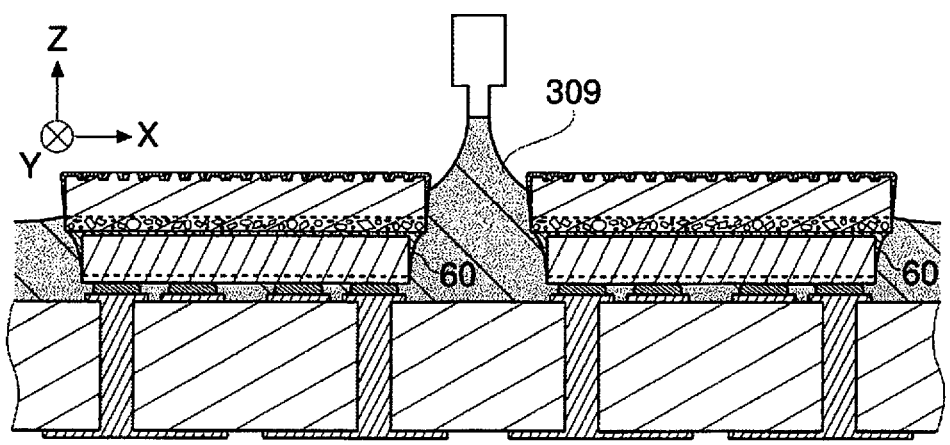
FIG. 2D is a schematic cross section view showing one step of the method of manufacturing a light emitting device of an embodiment of the present invention.
Figure 2E:
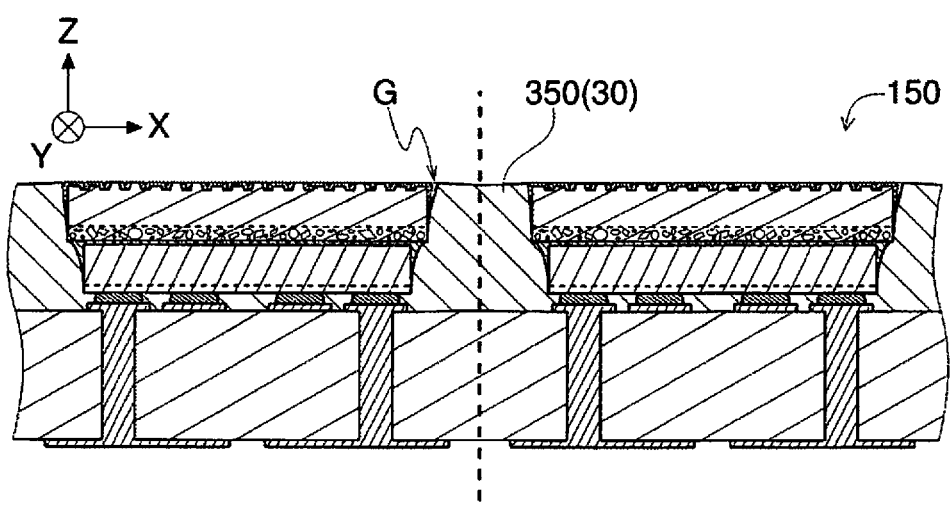
FIG. 2E is a schematic cross section view showing one step of the method of manufacturing a light emitting device of an embodiment of the present invention.

FIGS. 2A and 2B are schematic cross section views showing a first step of the method of manufacturing the light emitting device 100 according to Embodiment 1. FIGS. 2C, 2D, and 2E are schematic cross section views showing a second step, third step, and fourth step of the method of manufacturing the light emitting device 100 of Embodiment 1.

The method of manufacturing the light emitting device 100 of Embodiment 1 is provided with at least the kind of first step, second step, and third step described hereafter. According to the method of manufacturing the light emitting device 100 having such configuration, it is possible to manufacture a light emitting device in which cracks in the wavelength conversion member 21 and/or the light reflective member 30 is less likely to occur. Here, a description is given for the first to third steps of manufacturing a light emitting device composite 150, which includes a fourth step of dividing the light emitting device composite 150. Working in this way, it is possible to manufacture the light emitting device 100 with good productivity.

As shown in FIGS. 2A and 2B, the first step is a step of providing the transmissive member 20 having the wavelength conversion member 21 and the film 27. In this step, the film 27 is provided on the outermost surface of the side surface of the transmissive member 20. Also, the base material of the film 27 has a surface free energy that is lower than a surface free energy of the base material of the wavelength conversion member 21. Specifically, the transmissive member 20 is produced by forming the film 27 at least on the side surface of the wavelength conversion member 21. For example, first, a liquid material 279 containing the base material of the film 27 is applied on at least the side surface of the wavelength conversion member 21. This liquid material 279 can also contain a volatile solvent and/or a binding agent (i.e., binder). For applying of the liquid material 279, it is preferable to use a spraying method (show in FIG. 2A) or a dipping method (shown in FIG. 2B), from the perspective of productivity, etc. Then, the base material of the film 27 is fixed to at least the side surface of the wavelength conversion member 21 by heating or cooling, etc. Then, the base material of the film 27 can be hardened or solidified. It is also possible to eliminate the volatile solvent by vaporizing it. Use of the binding agent can increase the adhesive force of the base material of the film 27 to the side surface of the wavelength conversion member 21. In the term "providing of the transmissive member 20", "providing" includes purchasing an existing product, etc., in addition to producing it in-house as described above.

As shown in FIG. 2C, the second step is a step of placing the transmissive member 20 on the light emitting element 10. Specifically, for example, first, a liquid material 609 of the light guide member is applied on one or both of the light emitting element 10 and the transmissive member 20. Then, after connecting the light emitting element 10 and the transmissive member 20 with the liquid material 609 of the light guide member interposed, the liquid material 609 of the light guide member is hardened or solidified. In more detail, after applying the liquid material 609 of the light guide member on the surface opposite the primary light emission surface of the transmissive member 20 (i.e., the surface that will later become the lower surface), the primary light emission surface of the light emitting element 10 (i.e., the surface that will later become the top surface) is connected to the liquid material 609 of the light guide member. Alternatively, after applying the liquid material 609 of the light guide member on the primary light emission surface of the light emitting element 10 (i.e., the surface that will later become the top surface), the surface opposite the primary light emission surface of the transmissive member 20 (i.e., the surface that will later become the lower surface) is connected to the liquid material 609 of the light guide member. At this time, preferably, the liquid material 609 is applied such that the liquid material 609 of the light guide member creep up the side surface of the light element 10, from the perspective of the light extraction efficiency. Examples of method of applying the liquid material 609 of the light guide member are dispensing method, a transfer method, a dipping method.

As shown in FIG. 2D, the third step is a step of forming the light reflective member 30 so as to enclose and cover the side surface of the light emitting element 10 and the side surface of the transmissive member 20. In specific terms, for example, a liquid material 309 of the light reflective member is applied on the side surface of the light emitting element 10, thereafter hardened or solidified. With this Embodiment 1, the side surfaces of a plurality of light emitting elements 10 are continuously covered to form a light reflective member composite 350. At this time, the liquid material 309 of the light reflective member preferably reaches the surface opposite the primary light emission surface of the light emitting element 10 (i.e., the surface that will later become the bottom surface excluding the positive and negative electrodes). By the light reflective member 30 continuously covering up to the surface opposite the primary light emission surface of the light emitting element 10 (i.e., the surface that will later become the bottom surface excluding the positive and negative electrodes), it is possible to increase the light extraction efficiency in the primary light emitting direction. The light reflective member 30 can be formed by potting, compression molding, transfer molding, injection molding, etc. Among these, potting is preferable because it is simple.

As shown in FIG. 2E, the fourth step is a step of dividing the light emitting device composite 150. Specifically, for example, predetermined positions of the light emitting device composite 150, specifically, the region where the light reflective member composite 350 and a wiring substrate composite 450 are layered between the light emitting elements 10, is cut in line or grid pattern to singulate the light emitting device 100. For cutting the light emitting device composite 150, it is possible to use a dicer, an ultrasonic cutter, a Thomson blade, a break blade, etc. When manufacturing the light emitting devices 100 individually one at a time, this fourth step can be omitted.

Embodiment 2

Figure 3A:
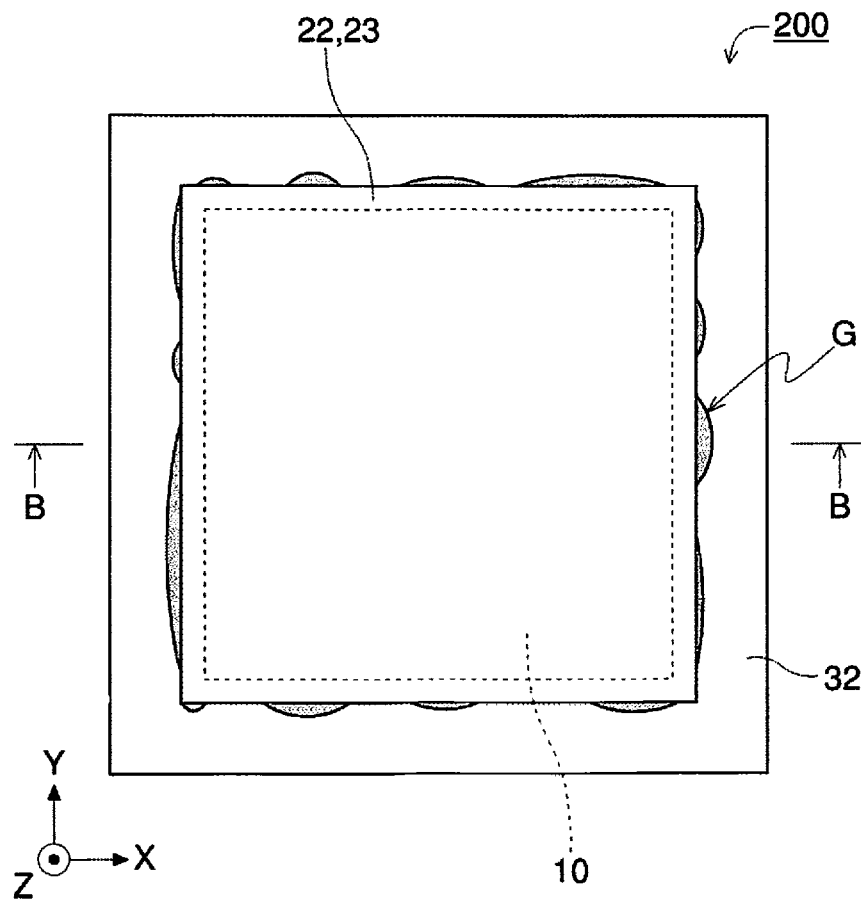
FIG. 3A is a schematic top view of the light emitting device of another embodiment of the present invention.
Figure 3B:
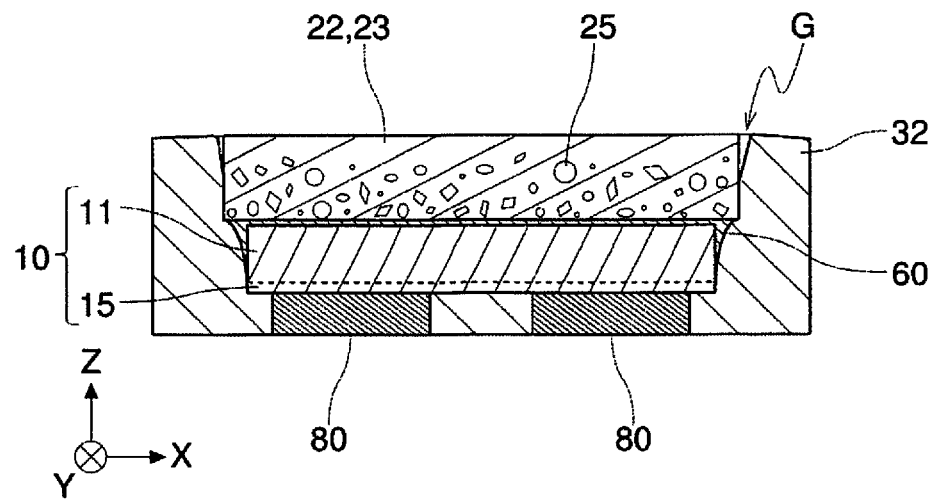
FIG. 3B is a schematic cross section view taken along a line B-B of the light emitting device shown in FIG. 3A.

FIG. 3A is a schematic top view of a light emitting device 200 of Embodiment 2. FIG. 3B is a schematic cross section view taken along a line B-B of the light emitting device 200 shown in FIG. 3A. This light emitting device 200 differs from the light emitting device 100 of Embodiment 1 in regards to the point that it does not include the film 27, the wiring substrate 40, the joining member 50, and the protective element 70, but includes electrodes 80, as well as in terms of the form of a wavelength conversion member 23. Other than that the light emitting device 200 of Embodiment 2 is substantially the same as the light emitting device 100 of Embodiment 1, thus explanation is omitted as appropriate.

As shown in FIGS. 3A and 3B, the light emitting device 200 of Embodiment 2 includes the light emitting element 10, a transmissive member 22, and a light reflective member 32. The transmissive member 22 is provided above the light emitting element 10. The transmissive member 22 includes the wavelength conversion member 23. The light reflective member 32 covers the side surface of the light emitting element 10. The light reflective member 32 encloses the side surface of the transmissive member 22. Also, the top end part of the light reflective member 32 is positioned at approximately the same height as the top surface of the transmissive member 22, and is separated from the side surface of the transmissive member 22 by the gap G.

In this way, the light emitting device 200 of Embodiment 2 has the gap G between the top end part of the light reflective member 32 and the side surface of the transmissive member 22. This can reduce the stress caused by mutually pressing force due to thermal expansion of the wavelength conversion member 23 and/or the light reflective member 32. Also, the light traveling and/or heat transmittance from the wavelength conversion member 23 to the light reflective member 32 is inhibited, making it possible to suppress degradation of the light reflective member 32 due to light and/or heat. From the points noted above, the light emitting device 200 of embodiment 2 sin which cracks of the wavelength conversion member 23 and/or the light reflective member 32 are less likely to occur. Thus, it is easy to maintain initial characteristics such as light distribution, etc., over a long period, and possible to have a light emitting device with high reliability. The gap G of this kind of light emitting device 200 can also be formed by eliminating the film 27 after the step of forming the light reflective member 30 in Embodiment 1.

The light emitting device 200 of Embodiment 2 further includes a light guide member 60 and electrodes 80. The light emitting element 10 includes the substrate 11 and the semiconductor layer 15. The substrate 11 side of the light emitting element 10 is connected to the transmissive member 22 with the light guide member 60 interposed. The semiconductor layer 15 side of the light emitting element 10 is connected to the pair of electrodes 80. The transmissive member 22 serves as the wavelength conversion member 23. The wavelength conversion member 23 contains the fluorescent substance 25. The wavelength conversion member 23 is configured with a single layer. The fluorescent substance 25 are localized at the lower side in the wavelength conversion member 23. The pair of electrodes 80, configures the bottom surface of that light emitting device 200 together with the light reflective member 32.

Hereafter, an explanation is given for each constituent of the light emitting device according to an embodiment of the present invention.

Light Emitting Element 10

For the light emitting element, a semiconductor light emitting element is preferable, but an organic EL element is also acceptable. An example of a semiconductor light emitting element includes a light emitting diode (LED) chip, for example. The semiconductor light emitting element has at least a semiconductor layer that configures the light emitting element structure, and may also further have a substrate. The light emitting element preferably has a quadrilateral shape, in particular a square shape or a rectangle shape that is elongated in one direction, in a top view. The side surface of the light emitting element or its substrate can be perpendicular to the top surface, or can be inwardly or outwardly. The light emitting element preferably includes positive-negative (p, n) electrodes on the same surface side. When the light emitting element is a flip-chip (i.e., face down) mounted type, the primary light emission surface is the surface opposite the electrode formation surface. Single of plurality of the light emitting element can be mounted on one light emitting device. The plurality of light emitting elements can be connected in series or in parallel.

Substrate 11

For the substrate, a substrate for crystal growth (i.e., a substrate on which a semiconductor crystal can be grown) is preferable due to its convenience, but a substrate for bonding with which a semiconductor layer is separated from the crystal-growth substrate is bonded. By the substrate being transmissive, it is easier to use flip-chip mounted, and easier to increase the light extraction efficiency. As the substrate, it is possible to use one item from among sapphire, gallium nitride, aluminum nitride, silicon, silicon carbide, gallium arsenide, gallium phosphide, indium phosphide, zinc sulfide, zinc selenide, and inorganic glass. Among these, sapphire is preferable in light of the points that it has good transmissivity, and is easy to obtain at relatively low cost as a substrate for crystal growth of a nitride semiconductor. Also, gallium nitride is suitably used as a substrate for crystal growth of a nitride semiconductor, and is preferable from the point of having relatively high thermal conductivity. The substrate thickness can be selected as appropriate, but is preferably 50 µm-500 µm, and more preferably 80 µm-300 µm from the perspective of light extraction efficiency, mechanical strength, etc.

Semiconductor Layer 15

The semiconductor layer includes at least an n type semiconductor layer and a p type semiconductor layer, and preferably includes an active layer interposed between them. As the semiconductor material, it is preferable to use a nitride semiconductor that can efficiently emit short wavelength light excitable the fluorescent substance. The nitride semiconductor is mainly represented by the general formula $In_xAl_yGa_{1-x-y}N$ (0≤x, 0≤y, x+y≤1). Other than that, it is also possible to use zinc sulfide, zinc selenide, silicon carbide, etc. The emission peak wavelength of the light emitting element is preferably in the blue range, and more preferably in a range of 450 nm-475 nm, from the perspective of light emitting efficiency, as well as excitation of fluorescent substance and the mixed color relationship with light emitted from the fluorescent substance, etc. The thickness of the semiconductor layer can be selected as appropriate, but is preferably in a range of 1 µm-10 µm, and more preferably 3 µm-10 µm, from the perspective of light emitting efficiency, crystallinity, etc.

Transmissive Member 20, 22

The transmissive member has a function of transmitting light of the light emitting element to outside of the device while protecting the light reflective member as well as the light emitting element from outside air and external forces, etc. The transmissive member at least includes the wavelength conversion member. When the transmissive member includes a film, the film can have a different member interposed between the film and the conversion member, but it is preferable that the film be in contact with the wavelength conversion member.

Wavelength Conversion Member 21, 23

The wavelength conversion member is configured with transmissive base materials in which a fluorescent substance is contained. In a top view, the wavelength conversion member is larger than the light emitting element, and that is numerically similar to the top view shape of the light emitting element is preferable in terms of light intensity distribution and chromaticity distribution, etc. If the top surface and/or the bottom surface of the wavelength conversion member is planner surface, good productivity can be realized. If the top surface and/or the bottom surface of the wavelength conversion member is a surface with irregularities or is a curved surface, the light extraction efficiency increases. The wavelength conversion member can be configured with a single layer, or can be a configured with multiple layers, in the thickness direction. When the wavelength conversion member is configured with a layer, it is possible to use various different types of base materials for each layer, and possible to contain different types of fluorescent substance in each layer. Also, the outermost layer being a layer that does not contain or is substantially free of a fluorescent substance, thus the fluorescent substance is less likely to degrade due to outside air, etc. The thickness of the wavelength conversion member can be selected as appropriate, but is preferably 50 µm-500 µm, and more preferably 80 µm-300 µm, from the viewpoint of light extraction efficiency, the fluorescent substance content, etc. For the base materials of the wavelength conversion member, it is possible to use at least one of silicone resin, epoxy resin, phenol resin, polycarbonate resin, acrylic resin, modified resins of these, and in organic glass. Specifically, the wavelength conversion member preferably includes a layer having silicone resin or its modified resin as the base material. Silicone resin and its modified resin are particularly good in terms of heat resistance and light resistance among resin materials, and are more easily formed than inorganic glass, on the other hand, the thermal expansion coefficient is relatively large, thus the effects of the configuration of this embodiment likely to exhibit. Silicone resin or its modified resin are preferable in terms of being good in terms of heat resistance and light resistance. Specific examples of the silicone resin include dimethyl silicone resin, phenyl methyl silicone resin, and diphenyl silicone resin. Among these, dimethyl silicone resin which has high light resistance is preferable. A resin used can have enhanced heat resistance and gas barrier properties by including a phenyl base. The content of the phenyl base to the total organic base bonded with silicon atoms in the silicone resin or a modified resin thereof is preferably 10 mol %-70 mol %, and more preferably 20 mol %-60 mol %. The "modified resins" in this specification include hybrid resins. Also, the wavelength conversion member preferably includes a layer having inorganic glass as the base material. Inorganic glass is superior to silicone resin in terms of heat resistance and light resistance, and on the other hand, it has relatively high surface free energy, thus the effect of reducing wettability by the film is large, and the effects of the configuration of this embodiment are likely to exhibit.

Fluorescent Substance 25

The fluorescent substance absorbs at least a portion of light emitted from the light emitting element (i.e., primary light), and emits light of a different wavelength from the primary light (i.e., secondary light). By this wavelength conversion function, it is possible to have a light emitting device that emits visible wavelength primary light and secondary light mixed color light such as white light, for example. In the case of a white light emitting light emitting device, the emitted light color range preferably compliant with the ANSI C78.377 standard. The content of the fluorescent substance in the wavelength conversion member can be selected as appropriate according to the desired chromaticity of emitted light, but, for example, is preferably 40 parts by weight-250 parts by weight, and more preferably 70 parts by weight-150 parts by weight. The term "parts by weight" represents weight (g) of the mixed particle to 100 g by weight of the base materials. The emission peak wavelength of the green light emitting fluorescent substance is preferably in the range of 520 nm-560 nm from the perspective of light emitting efficiency, and the mixed color relationship with light of other light sources, etc. Specific example of the green light emitting fluorescent substance include yttrium-aluminum-garnet based phosphor (e.g. $Y_3(Al, Ga)_5O_{12}$:Ce), lutetium-aluminum-garnet based phosphor (e.g. $Lu_3(Al, Ga)_5O_{12}$:Ce), terbium-aluminum-garnet based phosphor (e.g. $Tb_3(Al, Ga)_5O_{12}$:Ce), silicate based phosphor (e.g. $(Ba, Sr)_2SiO_4$:Eu), chlorosilicate based phosphor (e.g. $Ca_8Mg(SiO_4)_4C_{12}$:Eu), β SiAlON based phosphor (e.g. $Si_{6-z}Al_zO_zN_{8-z}$:Eu ($0<z<4.2$)), SGS based phosphor (e.g. $SrGa_2S_4$:Eu). Examples of the yellow light emitting fluorescent substance include α SiAlON based phosphor (e.g. $Mz(Si, Al)_{12}(O,N)_{16}$ (where $0<z\leq2$, and M is Li, Mg, Ca, Y, or a lanthanoid element except for La and Ce)). Some of the aforementioned green light emitting fluorescent substance also emit yellow light. Also, for example, the yttrium-aluminum-garnet based phosphors can emit yellow light by substituting a portion of Y with Gd to shift the light emission peak wavelength to the longer wavelength side. Among these, there are also fluorescent substances that can emit orange light. The emission peak wavelength of the fluorescent substances that emit red light is preferably in the range of 620 nm-670 nm from the perspective of light emitting efficiency and the mixed color relationship with light of other light sources, etc. Specific examples of the red light emitting fluorescent substance include nitrogen-containing calcium aluminosilicate (CASN or SCASN) based phosphor (e.g. (Sr, Ca)AlSiN$_3$:Eu), BSESN based phosphor (e.g., Ba, Sr, Ca)$_2$Si$_5$N$_8$:Eu), etc. In addition, examples include phosphors represented by manganese activated fluoride based phosphors (phosphors represented by the general formula (I) $A_2[M_{1-a}Mn_aF_6]$ (where in the aforementioned general formula (I), A is at least one type selected from a group comprising K, Li, Na, Rb, Cs, and NH$_4$, M is one type of element selected from a group comprising Group IV elements and Group XIV elements, and a satisfies $0<a<0.2$)). Representative example of this manganese activated fluoride based phosphor includes a manganese activated potassium fluorosilicate phosphor (e.g. $K_2SiF_6$:Mn). The fluorescent substance can be configured with only one type among the specific examples noted above, or to combine two or more types thereof. For example, the fluorescent substance can be configured with phosphors that emit green to yellow light, and phosphors that emit red light. Using this kind of configuration enables light emission with good color reproduction or good color rendering properties. Such configuration requires, however, a large amount of the fluorescent substance used, and that is accompanied by increased heat generation, thereby allowing the configuration of the light emitting device of this embodiment to exhibit effects. It is also particularly preferable that the red light emitting phosphor be a manganese activated fluoride based phosphor. The manganese activated fluoride based phosphors can emit light with narrow half width of spectral line in the red range, but is likely to be needed in a large amount used since the light emitting efficiency is relatively low. Accordingly, the heat generation easily increases, thus the configuration of the light emitting device of this embodiment is likely to exhibit effects.

Film 27

The film contains at least a base material whose surface free energy is relatively low, as described hereafter, and can further contain a binding agent (e.g., binder), etc. The surface free energy of the film base material is preferably 30 mN/m or less, more preferably 20 mN/m or less, and even more preferably 10 mN/m or less. The lower limit value of the surface free energy of the film base material is 7 mN/n, for example. Also, regarding a contact angle with pure water, it is preferably 90° or greater, more preferably 100° or greater, and even more preferably 110° or greater. As the base material of the film, silicone-based materials are preferable, and fluorine-based materials are more preferable, from the perspective of reduction in wettability. Examples of the silicone-based material include dimethyl silicone, methyl hydrogen silicone, or modified resins thereof. Examples of the fluorine-based material include polytetrafluoroethylene (PTFE), tetrafluoroethylene-hexafluoropropylene copolymer (FEP), tetrafluoroethylene-perfluoroalkyl vinyl ether copolymer (PFA), etc.

Light Reflective Members 30, 32

The light reflective member is preferably white from the perspective of light extraction efficiency. Thus, the light reflective member preferably contains white pigment in the base materials. The base material of the light reflective member can be selected from at least one item among silicone resin, epoxy resin, phenol resin, polycarbonate resin, acrylic resin, modified resins of these, and inorganic glass. Among these, silicone resin or a modified resin thereof is preferable due to its good heat resistance and light resistance. Specific examples of silicone resins include dimethyl silicone resin, phenyl methyl silicone resin, and diphenyl silicone resin. Among these, dimethyl silicone resin which has high light resistance is preferable. A resin used can have enhanced heat resistance and gas barrier properties by including a phenyl base. The content of the phenyl group within the total organic groups bonded to silicon atoms in the silicone resin or modified resin thereof is preferably 10 mol %-70 mol %, and more preferably 20 mol %-60 mol %. For the white pigment, it is possible to use one type alone or a combination of two or more items from among titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. Among these, titanium oxide is preferable due to its good light reflectivity and availability at relatively low cost. The content of white pigment within the light reflective member can be selected as appropriate, but is preferably 20 parts by weight-300 parts by weight, and more preferably 30 parts by weight-200 parts by weight, from the perspective of light reflectivity and viscosity of the base material in liquid state.

Wiring Substrate 40

The wiring substrate is configured from at least wiring, and a base for holding the wiring. In addition to this, the wiring substrate can also include an insulating protective film such as a solder resist or a cover lay, etc. The writing is formed at least on the top surface of the substrate, and can also be formed on the substrate interior and/or the side surface and/or the bottom surface. The wiring preferably includes, for example, an element connection terminal part on which the light emitting element is to be mounted, an external connection terminal part connected with external circuits, and lead wiring parts for connecting between these terminal parts. The wiring can be formed from copper, iron, nickel, tungsten, chrome, aluminum, silver, gold, titanium, palladium, rhodium, or alloys of these. The wiring can be configured with a single layer or multiple layers of these metals or alloys. In particular, copper or copper alloys are preferable from the perspective of heat dissipation. The surface layer of the wiring may include a layer of silver, platinum, aluminum, rhodium, gold, or alloys of these, etc., from the perspective of joining member wettability and/or light reflectivity. In the case of a rigid substrate, the base of the substrate can be configured using resin or a fiber reinforced resin, ceramic, inorganic glass, metal, paper, etc. Examples of the resin or fiber reinforced resin include epoxy, glass epoxy, bismaleimide-triazine (BT), polyimide, etc. Examples of ceramics include aluminum oxide, aluminum nitride, zirconium oxide, zirconium nitride, titanium oxide, titanium nitride, or mixtures of these, etc. Examples of metals include copper, iron, nickel, chrome, aluminum, silver, gold, titanium, or alloys of these. In the case of a flexible substrate, the substrate can be configured using polyimide, polyethylene terephthalate, polyethylene naphthalate, liquid crystal polymer, cycloolefin polymer, etc.

Joining Member 50

The joining member has electrical conductivity, and can join the light emitting element to the wiring substrate. The joining member can be selected from any one item from among: bumps configured with a gold, silver, or copper, etc.; a metal paste containing a resin binder with a metal powder such as silver, gold, copper, platinum, aluminum, palladium, etc.; solder of a tin-bismuth type, tin-copper type, tin-silver type, or gold-tin type, etc.; a brazing material such as a low melting point metal, etc.

Light Guide Member 60

The light guide member is transmissive, and guides light from the light emitting element to the transmissive member, as well as capable of adhering the light emitting element and the transmissive member. The outer surface of the light guide member, specifically, the interface with the light reflective member, is preferably inclined or curved in relation to the side surface of the light emitting element and the bottom surface of the transmissive member, from the perspective of light extraction efficiency. The base materials of the light guide member can be selected from at least one item among silicone resin, epoxy resin, phenol resin, polycarbonate resin, acrylic resin, modified resins of these, and inorganic glass. Among these, silicone resin or a modified resin thereof is preferable due to its good resistant to heat and light. Specific examples of silicone resin include dimethyl silicone resin, phenyl methyl silicone resin, and diphenyl silicone resin. Among these, dimethyl silicone resin is preferable due to its high light resistance. The light guide member can also contain various fillers in the base materials to adjust the thermal conductivity, coefficient of thermal expansion, etc.

Protective Element 70

The protective element is capable of protecting the light emitting element from static electricity and/or high voltage surges, thus can increase the reliability of the light emitting device. Specifically, a Zener diode, etc., can be used.

Electrode 80

The electrodes can be the positive and negative electrodes of the light emitting element itself, or can also be provided separately, connected to the positive and negative electrodes of the light emitting element. Examples of the separately provided electrodes include bumps, pillars, or lead electrodes (i.e., singulated lead frames), etc. The electrodes can be configured as small pieces of metal or an alloy. Specific Examples of the electrodes include at least one item among gold, silver, copper, iron, tin, platinum, zinc, rhodium, titanium, nickel, palladium, aluminum, tungsten, chrome, molybdenum, and alloys thereof. Among these, copper has good thermal conductivity and is relatively low cost, thus copper or a copper alloy is preferable. Also, gold has a good bondability due to the property of chemically stable and less likely to undergo surface oxidation so, thus gold or a gold alloy is also preferable. From the perspective of solder bondability, the electrodes can also have a gold or silver film on the surface.

Above, the light emitting device of Embodiments 1 and 2 has been exemplified as the top surface light emitting (i.e., top view) type, but it is also possible to use as a side surface light emitting (i.e., side view) type depending on the positional relationship of the external connection terminals (i.e., electrodes) in relation to the primary light emission direction. The mounting surface of the top view type light emitting device is roughly parallel to the primary light emission surface, and is opposite surface to the primary light emission surface. For example, the mounting surface of the light emitting device of Embodiments 1 and 2 is bottom side. On the other hand, the mounting surface of the side view type light emitting device is roughly perpendicular to the primary light emission surface.

Working Example

A description will be given of a detailed description of a working example of the present invention as follows. It also goes without saying that the present invention is not limited only to the working example shown below.

Working Example 1

The light emitting device of Embodiment 1 is a rectangular, top surface light emitting surface mount type LED device having dimensions of 1.45 mm width, 1.8 mm depth, and 0.79 mm thickness, and the structure of the light emitting device 100 of the example shown in FIGS. 1A and 1B. The wiring substrate 40 has dimensions of 1.45 mm width, 1.8 mm depth, and 0.4 mm thickness, and has a base of aluminum nitride, and a top surface wiring and lower surface wiring of titanium-tungsten/copper/nickel/gold. This top surface wiring and lower surface wiring are connected by through-vias filled with tungsten. The light emitting element 10 is flip-chip mounted on the top surface wiring of the wiring substrate 40 via gold bump joining member 50 having a 0.01 mm thickness. The light emitting element 10 is an LED chip having a square shape from the top view, dimensions of 1 mm width, 1 mm depth, and 0.14 mm thickness, capable of emitting blue light having 452 nm of emission peak wavelength. The light emitting element 10 includes the sapphire substrate 11, and the semiconductor layer 15 configured with a nitride semiconductor formed on the bottom surface side of the substrate 11. The transmissive member 20 is connected to the top surface side of the light emitting element 10 with the light guide member 60 interposed. The transmissive member 20 is configured by the wavelength conversion member 21 and the film 27. The wavelength conversion member 21 is a small piece that is square shaped in the top view with dimensions of 1.15 mm width and 1.15 mm depth, and is configured with an upper layer and a lower layer. The upper layer is a transparent layer with 0.14 mm thick formed with borosilicate glass as a main component. The lower layer is a 0.77 mm thick, layer formed with dimethyl silicone resin as the main component in which a YAG-based phosphor and a SCASN-based phosphor are contained as the fluorescent substance 25. The top surface of the wavelength conversion member 21 has irregularities. The film 27 is provided from the top surface of the transmissive member 20 to the bottom side of the side surface via the top end part of the side surface (corner formed by the top surface and the side surface). In more detail, the covered surface area ratio of the side surface of the upper layer of the film 27 is 90% or greater, and the covered surface area ratio of the side surface of the lower layer is 10% or less. The film 27 is a thin film of thickness 0.01 mm having PTFE as the main component. Holes H are scattered in irregular form in the top view on the film 27. There are areas where the gap G is formed between the film 27 provided on the top end part of the side surface of the transmissive member 20 and the light reflective member 30. The light guide member 60 covers the side surface of the light emitting element 10 and the bottom surface of the transmissive member 20. The outer surface of the light guide member 60 is inclined or curved in relation to the side surface of the light emitting element 10 and the bottom surface of the transmissive member 20. The thickness of the light guide member 60 between the top surface of the light emitting element 10 and the bottom surface of the transmissive member 20 is 0.02 mm. The light guide member 60 is configured with a hardened substance of a transmissive dimethyl silicone resin. The light reflective member 30 is provided on the wiring substrate 40, and encloses the side of the light emitting element 10 and the side of the transmissive member 20. The light reflective member 30 covers the outer surface of the light guide member 60 at the side of the light emitting element 10, and covers the region excluding the positive and negative electrodes of the bottom surface of the light emitting element 10 at the bottom of the light emitting element 10. If the light guide member 60 does not cover a portion of the side surface of the light emitting element 10 (particularly the bottom end part), then the light reflective member 30 covers a portion of that side surface of the light emitting element 10 (particularly the bottom end part). The top end part of the light reflective member 30 is near the side surface of the transmissive member 20, and has approximately the same height as the top surface of the transmissive member 20. The light reflective member 30 does not cover the top surface of the transmissive member 20, and is exposed to the device exterior. The light reflective member 30 is a hardened substance of the dimethyl silicone resin as base material containing a titanium oxide white pigment of 30 parts by weight. The protective element 70 is a Zener diode having dimensions of 0.41 mm width, 0.33 mm depth, and 0.14 mm thickness. The protective element 70 is flip-chip mounted to the top surface wiring of the wiring substrate 40 with a gold bump interposed in such a manner as to be adjacent to the light emitting element 10.

As described hereafter, the light emitting device of this working example 1 is manufactured by producing the light emitting device composite 150, and dividing the light emitting device composite 150. First, the liquid material 279 containing the film base material is sprayed on the wavelength conversion member 21 placed on an adhesive sheet. At this time, the angle of the spray nozzle is adjusted such that the liquid material 279 containing the film base material adheres extending from the top surface of the wavelength conversion member 21 to the side surface. Also, the liquid material 279 containing the film base material is heated in an oven to fix this as the film 27 on the wavelength conversion member 21, then the transmissive member 20 is provided. The plurality of light emitting elements 10 and the same number as that of the protective elements 70 are mounted on the top surface wiring of the wiring substrate composite 450 in which a plurality of wiring substrates 40 are connected, with the gold bump joining member 50 interposed. The member liquid material 609 of the light guide member is applied on the top surface of each of the light emitting element 10 by pin transfer, and the transmissive members 20 are respectively disposed thereon. At this time, the pushing amount of the transmissive member 20 is adjusted, and the liquid material 609 of the light guide member is spread on the four side surfaces of the light emitting element 10. Then, the liquid material 609 is hardened in an oven to make the light guide member 60. The liquid material 309 of the light reflective member is supplied between each light emitting element 10 on the wiring substrate composite 450 up to the height of the top surface of each transmissive member 20. Supplying the liquid material 309 of the light reflective member is performed by a potting technique. The supplied liquid material 309 of the light reflective member is hardened in an oven to make the light reflective member composite 350. The resulting light emitting device composite 150 is cut in the following manner. Laser light is irradiated on the bottom surface of the wiring substrate composite 450 to form grid pattern scribe lines viewed from above. Using an ultra hard ultrasonic cutter, grid pattern incisions viewed from above are formed along the scribe lines on the top surface of the light reflective member composite 350. An ultra hard break blade is pushed onto the wiring substrate composite 450 from the incisions, and the wiring substrate composite 450 is split along the scribe lines.

The light emitting device of working example 1 configured as described above is able to exhibit similar effects as those of the light emitting device 100 of Embodiment 1.

The light emitting device of an embodiment of the present invention can be used for a backlight device of a liquid crystal display, various types of lighting equipment, large scale displays, various types of display devices such as for advertising or a destination guide, projector devices, and also for image reading devices of digital video cameras, fax machines, copy machines, scanners, etc.

What is claimed is:
1. A light emitting device comprising:
   a light emitting element;
   a transmissive member arranged on the light emitting element, and including a wavelength conversion member and a film, the film constituting at least a majority of a top surface of the transmissive member and at least a part of an outermost surface of a side surface of the transmissive member, a surface free energy of a base material of the film being lower than a surface free energy of a base material of the wavelength conversion layer; and a light reflective member enclosing a side surface of the light emitting element and the side surface of the transmissive member while the top surface of the transmissive member is exposed from the light reflective member.

2. The light emitting device according to claim 1, wherein the film is arranged on at least a top end part of the side surface of the transmissive member.

3. The light emitting device according to claim 1, wherein a surface area of the film is larger at an upper half than at a lower half of the side surface of the transmissive member.

4. The light emitting device according to claim 1, wherein the wavelength conversion member includes a lower layer containing a fluorescent substance and an upper layer that is substantially free of a fluorescent substance, and ratio of a part of a side surface of the upper layer on which the film is arranged to a part of the side surface of the upper layer on which the film is not arranged is greater than a ratio of a part of a side surface of the lower layer on which the film is arranged to a part of the side surface of the lower layer on which the film is not arranged.

5. The light emitting device according to claim 1, wherein a gap is formed between the film and the light reflective member.

6. The light emitting device according to claim 5, wherein the gap is formed between the film arranged on a top end part of the side surface of the transmissive member, and the light reflective member.

7. The light emitting device according to claim 1, wherein the light reflective member covers a bottom end part of the side surface of the transmissive member.

8. The light emitting device according to claim 1, wherein the surface free energy of the base material of the film is lower than a surface free energy of a base material of the light reflective member.

9. The light emitting device according to claim 1, wherein the surface free energy of the base material of the film is 30 mN/m or less.

10. The light emitting device according to claim 1, wherein the base material of the film is a fluorine-based material.

11. The light emitting device according to claim 1, wherein
a base material of the light reflective member is a silicone resin or a modified resin of the silicone resin.

12. The light emitting device according to claim 1, wherein
the wavelength conversion member includes a layer in which the base material is a silicone resin or a modified resin of the silicone resin.

13. The light emitting device according to claim 1, wherein
the wavelength conversion member includes a layer in which the base material is inorganic glass.

14. A light emitting device comprising:
a light emitting element;
a transmissive member arranged on the light emitting element, and including a wavelength conversion member and a film, the film constituting at least a part of an outermost surface of a side surface of the transmissive member, a surface free energy of a base material of the film being lower than a surface free energy of a base material of the wavelength conversion layer, the film defining a plurality of holes; and
a light reflective member enclosing a side surface of the light emitting element and the side surface of the transmissive member while a top surface of the transmissive member is exposed from the light reflective member.

15. A light emitting device comprising:
a light emitting element;
a transmissive member arranged on the light emitting element, and including a wavelength conversion member and a film, the film constituting an outermost surface of the side surface of the transmissive member, and a surface free energy of a base material of the film being lower than a surface free energy of a base material of the wavelength conversion member; and
a light reflective member enclosing a side surface of the light emitting element and a side surface of the transmissive member, a top end part of the light reflective member being positioned at approximately the same height as a top surface of the transmissive member, and the top end part of the light reflective member being separated from the side surface of the transmissive member by a gap.

* * * * *